(12) United States Patent
Kawai

(10) Patent No.: US 6,406,990 B1
(45) Date of Patent: Jun. 18, 2002

(54) METHOD OF MOUNTING A SEMICONDUCTOR CHIP, CIRCUIT BOARD FOR FLIP-CHIP CONNECTION AND METHOD OF MANUFACTURING THE SAME, ELECTROMAGNETIC WAVE READABLE DATA CARRIER AND METHOD OF MANUFACTURING THE SAME, AND ELECTRONIC COMPONENT MODULE FOR AN ELECTROMAGNETIC WAVE READABLE DATA CARRIER

(75) Inventor: Wakahiro Kawai, Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/716,289

(22) Filed: Nov. 21, 2000

(30) Foreign Application Priority Data

Nov. 24, 1999 (JP) .......................................... 11-333409

(51) Int. Cl.⁷ .............................................. H01L 23/48
(52) U.S. Cl. ........................ 438/612; 257/778; 257/737
(58) Field of Search ................................ 438/612, 613, 438/614, 615; 257/737, 778, 777

(56) References Cited

U.S. PATENT DOCUMENTS 6,204,163 B1 * 3/2001 Panchou et al. ............ 438/613

FOREIGN PATENT DOCUMENTS

| JP | 6-243358 | * | 9/1994 |
| JP | 2586154 | * | 5/1996 |
| JP | 11-26922 | * | 1/1999 |
| JP | 2000-228426 | * | 8/2000 |

* cited by examiner

*Primary Examiner*—David Nelms
*Assistant Examiner*—Thao P Le
(74) *Attorney, Agent, or Firm*—Dickstein, Shapiro, Morin & Oshinsky LLP

(57) ABSTRACT

To provide a semiconductor chip mounting method by a flip-chip connection method in which a semiconductor chip can be mounted on a circuit board promptly, electrically and mechanically surely and further at a low cost, a process for pushing a melted thermoplastic resin coat aside by pressing a bump of the bare semiconductor chip on the melted thermoplastic resin coat applying an ultrasonic wave in a state in which the thermoplastic resin coat covering an electrode area on a wiring pattern is heated and melted and touching the bump and the electrode area, a process for bonding the bump and the electrode area by continuously applying an ultrasonic wave in a state in which the bump and the electrode area are touched and a process for cooling and solidifying the melted thermoplastic resin coat and bonding the body of the bare semiconductor chip on the circuit board are provided.

5 Claims, 15 Drawing Sheets

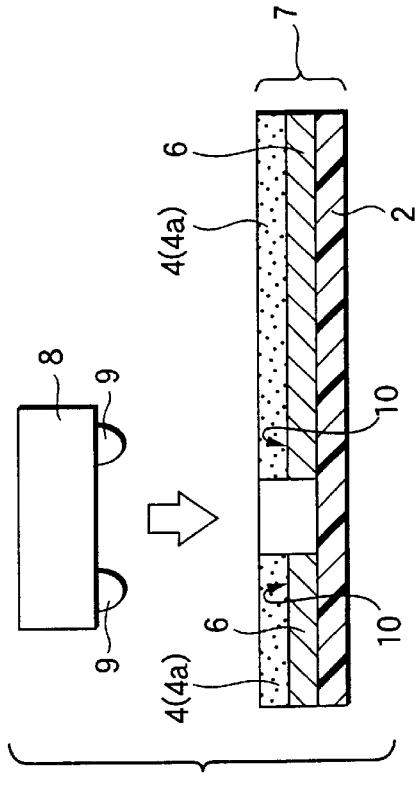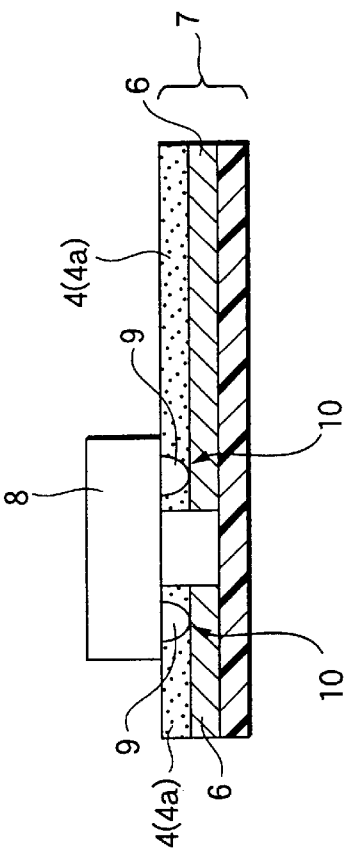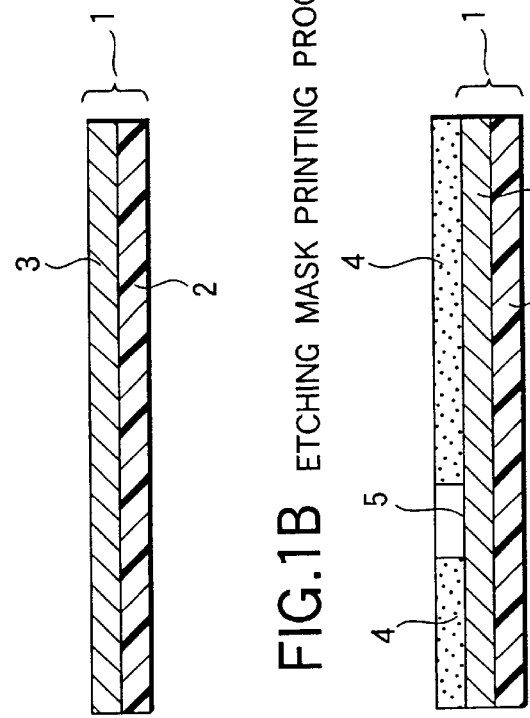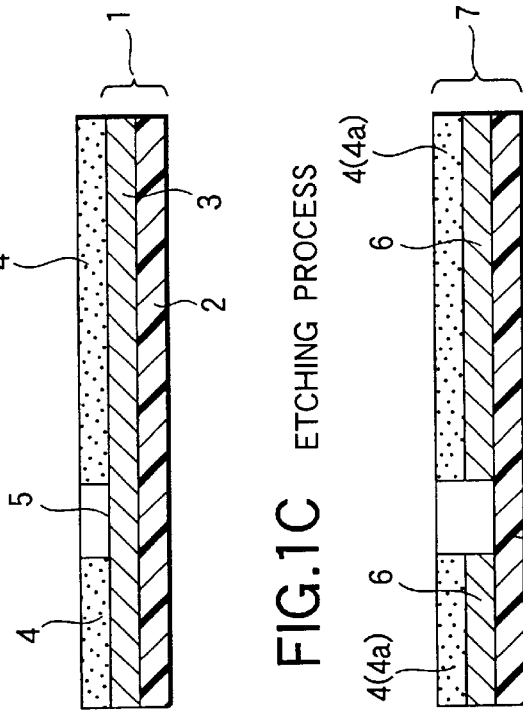

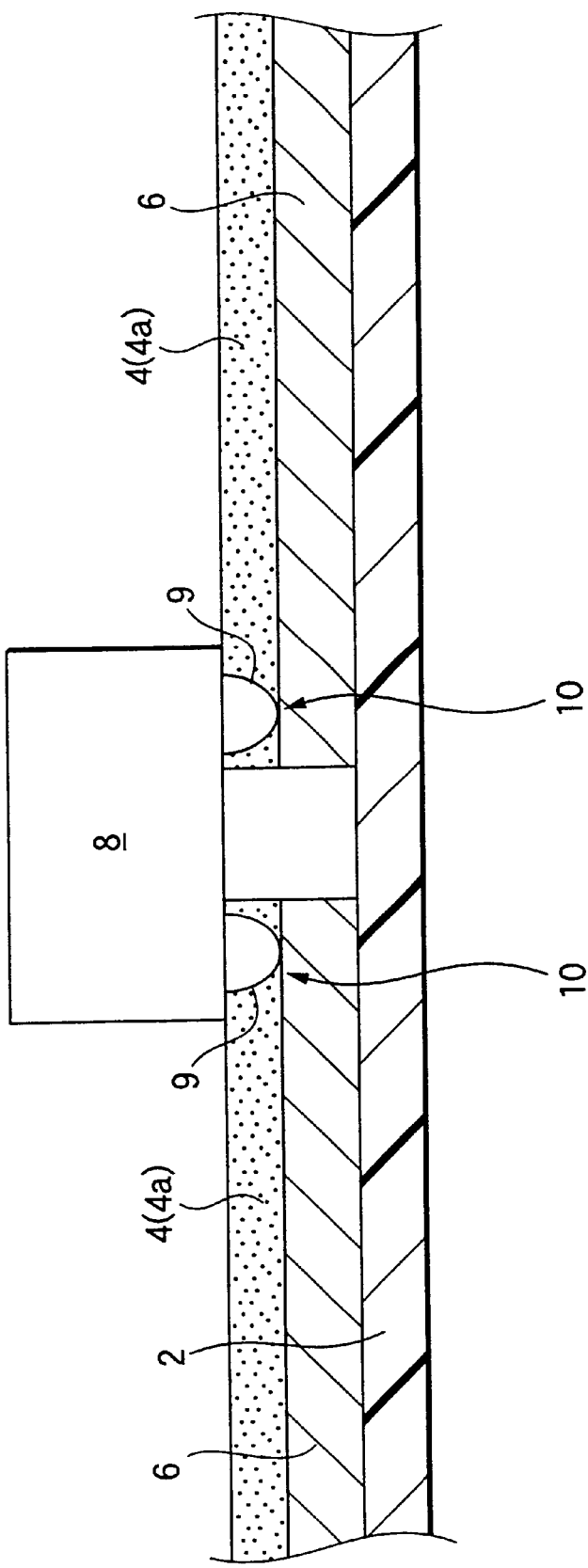

FIG.4

| SEMICONDUCTOR MOUNTING METHOD | ULTRASONIC BORDING OF FOUR-STUD BUMP | EMBODIMENT 1 |
|---|---|---|
| SHARE STRENGTH (g) | 200~250 | 500~800 |

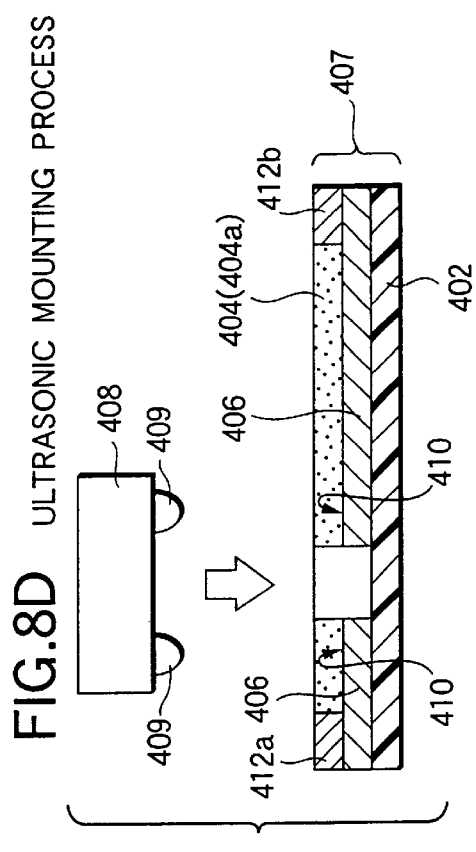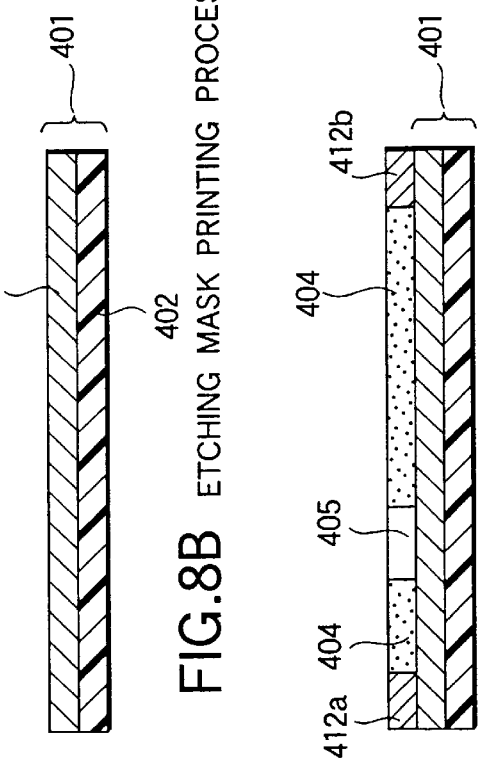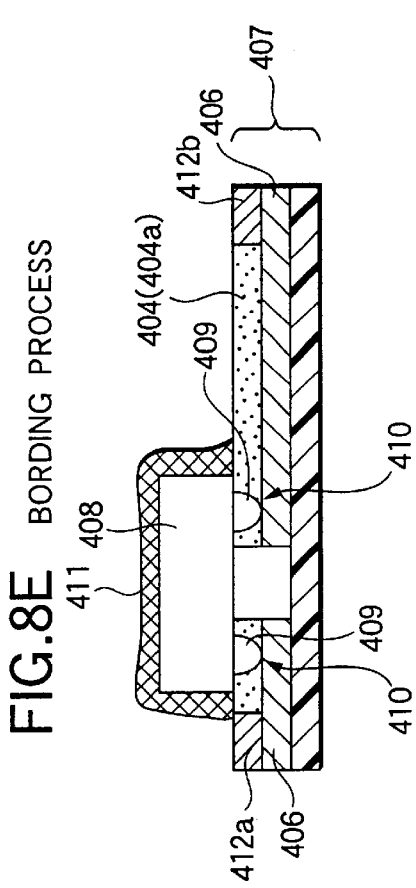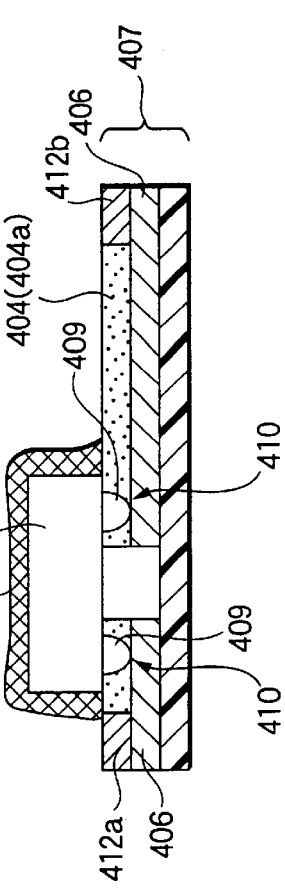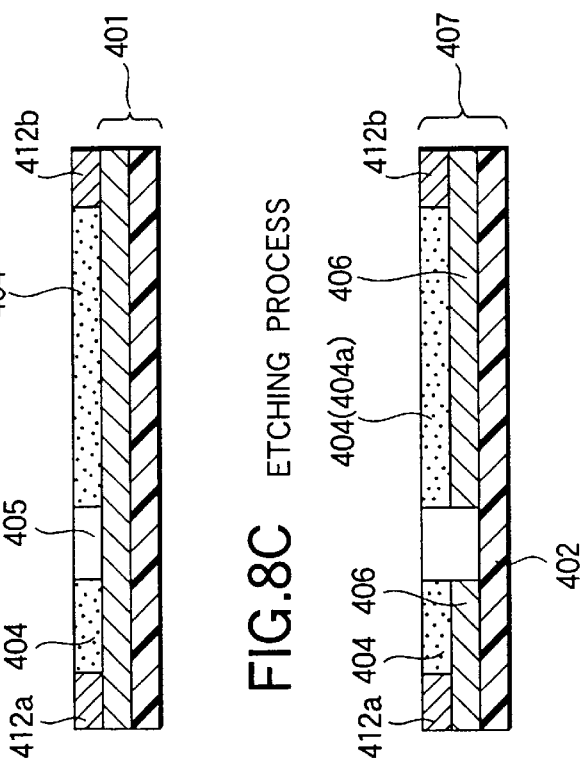

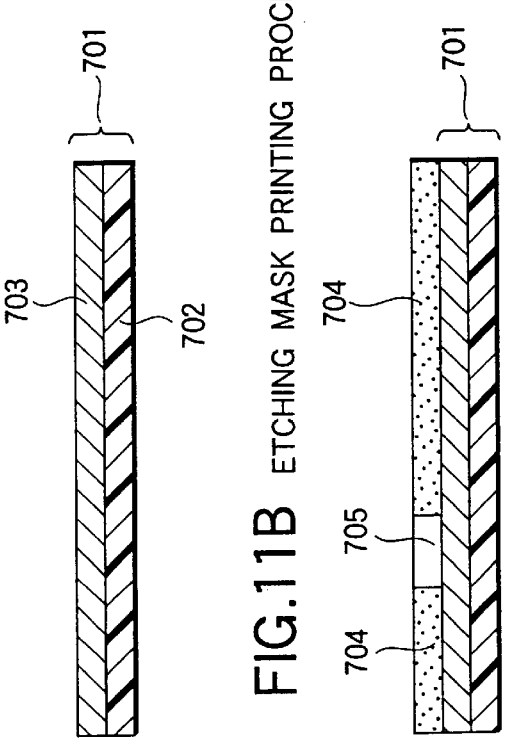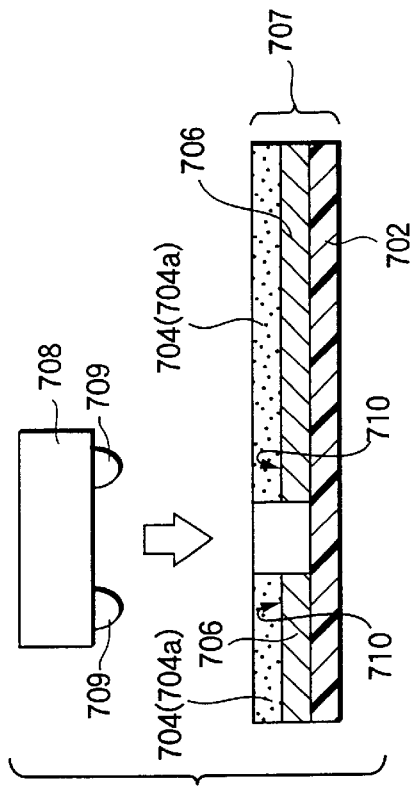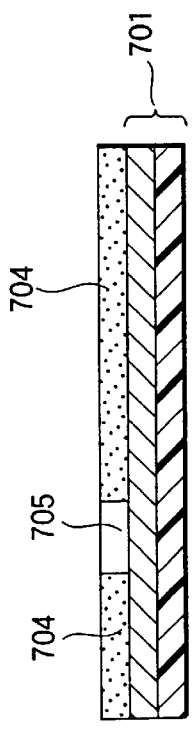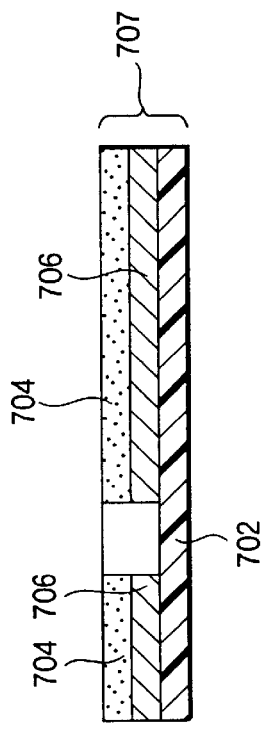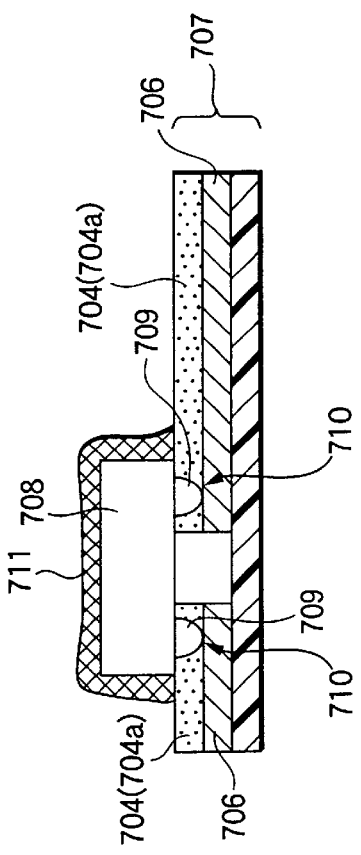

FIG.13

| ELAPSED TIME OF TEST | 0hr | 120hr | 250hr |
|---|---|---|---|
| COMMUNICATION DISTANCE (mm) | 95 | 106 | 101 |

PRIOR ART

PRIOR ART

METHOD OF MOUNTING A SEMICONDUCTOR CHIP, CIRCUIT BOARD FOR FLIP-CHIP CONNECTION AND METHOD OF MANUFACTURING THE SAME, ELECTROMAGNETIC WAVE READABLE DATA CARRIER AND METHOD OF MANUFACTURING THE SAME, AND ELECTRONIC COMPONENT MODULE FOR AN ELECTROMAGNETIC WAVE READABLE DATA CARRIER

BACKGROUND OF THE INVENTION

1. Field of the Invention

The present invention relates to a method of mounting a semiconductor chip which is suitable for manufacturing an electromagnetic wave readable data carrier that functions as a flight tag, a label for physical distribution management, a ticket for an unmanned wicket and others, particularly relates to a method of mounting semiconductor chip in which a bare semiconductor chip can be mounted on a circuit board at a low cost by a flip-chip connecting method. The present invention also relates to a circuit board for flip-chip connection and a method of manufacturing the same. In addition, the present invention relates to an electromagnetic wave readable data carrier and a method of manufacturing the same, and an electronic component module for an electromagnetic wave readable data carrier.

2. Description of the Related Art

For this type of electro magnetic wave readable data carrier, a flight tag disclosed in Japanese Patent Unexamined Publication No. Hei. 6-243358 for example is known. It is estimated that the flight tag will be used for the management of passenger's baggage at an airport as a throwaway tag in near future. At that time, in the case of a worldwide airline company, the enormous demand such as 8.5 million pieces per month can be expected by only the company. Therefore, as to this type of flight tag, the establishment of mass production technology at an extremely low cost is desired.

The flight tag disclosed in the patent application is composed by mounting a curled conductive pattern to be an antenna coil and IC components to be a send and receive circuit, a memory and others on the single side of a rectangular substrate made of a PET film.

The body of the flight tag that holds the curled conductive pattern to be an antenna coil can be formed by selectively etching copper foil and aluminum foil respectively coated on the single side of the PET film by etching processing. Therefore, a continuous production line by roll to roll (RTR) can be readily realized by a resist formation process by well-known photolithographic technology and the succeeding wet etching process and others. In the meantime, circuit components such as a send and receive circuit and a memory to be mounted on the body of the flight tag are integrated in one chip using semiconductor integration technology.

These applicants propose that a bare semiconductor chip is first moduled by mounting the bare semiconductor chip composing the send and receive circuit, the memory respectively described above and others on a thin insulating piece (a type of circuit board) and then the productivity of a flight tag is enhanced by bonding the electronic component module on a PET film composing the body of the flight tag.

As for an electronic component mounted sheet, the advanced thinning of which is requested, such as the electronic component module bonded to the flight tag, a flip-chip connection method in which a bare semiconductor chip is directly mounted on a circuit board is often proposed.

An example of the flip-chip connection method (hereinafter called a first related art type method) is shown in FIG. 14. In the first related art type method, a protruded terminal for connection (hereinafter called a bump) b is formed on the bottom electrode (not shown) of a semiconductor chip a and after the bump b and an electrode area d of a wiring pattern on a circuit board c are positioned, both are connected via joining material e such as solder and conductive paste.

In the first related art type method, a problem is pointed out such that the manufacturing cost is increased because (1) a process for supplying and hardening the joining material e for connecting the bump b and the electrode area d of the wiring pattern is complex, (2) an insulating resin f called underfill is filled between the chip a and the board c so as to seal a bump connection portion between the bump b and the electrode area d and thereby to acquire the reliability in the moisture-proof of the bump connected part and strength for mounting the semiconductor chip and (3) a process for filling and hardening the insulating resin f to be underfill is required.

Another example of the flip-chip connection method (a second related art type method) is shown in FIG. 15. The second related art type method is proposed to solve the problem of the first related art type method and a bare semiconductor chip is mounted on a circuit board using an anisotropic conductive sheet proposed in Japanese Patent No. 2586154.

In the second related art type method, an anisotropic conductive sheet g in which conductive particulates are dispersed in thermoplastic or thermosetting resin is put between a bare semiconductor chip a and a circuit board c, and the resin is made to flow by thermocompression bonding, so that electric connection in the direction of the thickness is acquired by conductive particulates h put between a bump b and an electrode area d of the wiring pattern.

According to this method, there is effect that the positioning of the circuit board with the wiring pattern when the semiconductor chip is mounted on the circuit board can be relatively roughly performed. In addition, time when resin is hardened is short, for example 10 to 20 seconds, sealing material such as under fill is not required to be used, and the manufacturing cost can be reduced. To the contrary, problems are further pointed out such that (1) the anisotropic conductive sheet g is relatively high-priced, (2) the anisotropic conductive sheet cannot be used for a board without heat resistance because the high temperature of 200° C. or more is required for hardening the sheet, (3) it takes 10 to 20 seconds to harden the resin though it is a relatively short time, and it is difficult to further simplify and speed up the process and (4) the reliability of connection is low because electric connection between the bump and the wiring pattern depends upon the contact of conductive particulates dispersed in the resin.

SUMMARY OF THE INVENTION

The invention is made to solve the problems in the related art type flip-chip connection method and the object is to provide a method of mounting semiconductor chip by a flip-chip connection method in which a semiconductor chip can be mounted on a circuit board promptly, electrically and mechanically securely and further at a low cost.

Also, another object of the invention is to provide a circuit board for flip-chip connection suitable for the above-mentioned mounting method.

Also, further another object of the invention is to provide a method of manufacturing a circuit board for flip-chip connection in which the above-mentioned circuit board can be manufactured simply and at a low cost.

Further, furthermore another object of the invention is to provide an electromagnetic wave readable data carrier and a method of manufacturing the same in which an electromagnetic wave readable data carrier that functions as a flight tag, a label for physical distribution management, a ticket for an unmanned wicket and others can be produced at a low cost in a mass.

Also, further another object of the invention is to provide an electronic component module for an electromagnetic wave readable data carrier.

The person skilled in the art will easily understand further another object and the effect of the invention by referring to the description of embodiments and others.

A method of mounting a semiconductor chip according to the invention is provided with a process for pushing a melted thermoplastic resin coat aside by pressing a bump of a bare semiconductor chip on the melted thermoplastic resin coat applying an ultra sonic wave in a state in which the thermoplastic resin coat covering an electrode area on a wiring pattern is heated and melted and touching the bump and the electrode area, a process for bonding the bump and the electrode area by continuously applying an ultrasonic wave in a state in which the bump and the electrode area are touched and a process for cooling and solidifying the melted thermoplastic resin and bonding the body of the bare semiconductor chip on a circuit board.

As clear from the description that in a state in which the thermoplastic resin coat covering an electrode area on a wiring pattern is heated and melted, a thermoplastic resin coat is formed beforehand in an electrode area on a wiring pattern of a circuit board used in the invention. This coat may also cover only an electrode area of a wiring pattern and may also cover the overall surface of a wiring pattern.

Also, a phrase, an electrode area on a wiring pattern described above means a fixed small area on a wiring pattern including a position for a terminal of an electronic component and others to be connected. In this electrode area, a part generally called a land and others on the wiring pattern is included.

Also, words, "heated and melted" mean both a state that the thermoplastic resin coat is heated and melted and a state that it is heated and softened to some extent. Further, it is desirable that thermoplastic resin described above has a satisfactory characteristic as an adhesive.

According to such configuration, action and effect are acquired that (1) secure electric conduction is acquired because the junction of the bump and the electrode area is diffused junction by an ultrasonic wave, (2) moisture-proof is satisfactory because the junction is sealed with resin, (3) mechanical mounting strength to pulling and others is high because the semiconductor chip and the circuit board are bonded when the thermoplastic resin is hardened, (4) electric conduction and mechanical bonding are simultaneously enabled in a short time, (5) the manufacturing cost is low because a process for special sealing and bonding and bonding material are not required and (6) the surface of the board is nevermore sticky than required in heating because no thermoplastic resin coat exists in a part in which the surface of the board is exposed.

Also, the overall surface of the wiring pattern of the circuit board for flip-chip connection according to the invention is covered with a thermoplastic resin coat.

According to such configuration, as the overall surface of the wiring pattern is covered with a thermoplastic resin coat in case the circuit board described above is used for the mounting method described above, sealed structure satisfactory in moisture-proof and bonded structure high in tensile strength are acquired.

Also, in a method of manufacturing the circuit board for flip-chip connection according to the invention, for an etching mask used when the wiring pattern is formed by etching processing, thermoplastic resin is used.

According to such configuration, as an etching mask used in etching processing for forming the wiring pattern is used for the thermoplastic resin coat covering the overall surface of a conductive pattern as it is, a special coat formation process is not required and much labor is not required, and therefore the manufacture at a low cost can be realized.

Also, in a method of manufacturing an electromagnetic wave readable data carrier according to the invention, the body of a data carrier in which a curled conductive pattern composing an antenna coil is held on thin or sheet insulating base material and an electronic component module in which a bare semiconductor chip composing a send and receive circuit, a memory and others is mounted on a wiring pattern of a thin or sheet circuit board are integrated.

In the data carrier manufacturing method, a process for manufacturing the electronic component module in which the bare semiconductor chip is mounted on the wiring pattern of the thin or sheet circuit board is mainly characteristic.

That is, in the process for manufacturing the electronic component module, a subprocess for pushing a melted thermoplastic resin coat aside by pressing a bump of the bare semiconductor chip on the melted thermoplastic resin coat applying an ultrasonic wave in a state in which the thermoplastic resin coat covering the electrode area on the wiring pattern is heated and melted and touching the bump and an electrode area, a subprocess for bonding the bump and the electrode area by continuously applying an ultrasonic wave in a state in which the bump and the electrode area are touched and a subprocess for cooling and solidifying the melted thermoplastic resin and bonding the body of the bare semiconductor chip on the circuit board are included.

According to such configuration, the electromagnetic wave readable data carrier that functions as a flight tag, a label for physical distribution management, a ticket for an unmanned wicket and others can be produced at a low cost in a mass owing to action and effect that (1) secure electric conduction is acquired because the junction of the bump and the electrode area is diffused junction by an ultrasonic wave, (2) moisture-proof is satisfactory because the junction is sealed with resin, (3) mechanical mounting strength to pulling and others is high because the semiconductor chip and the circuit board are bonded when the thermoplastic resin is hardened, (4) electric conduction and mechanical bonding are simultaneously enabled in a short time, (5) the manufacturing cost is low because a process for special sealing and bonding and bonding material are not required and (6) the surface of the board is never more sticky than required in heating because no thermoplastic resin coat exists in a part in which the surface of the board is exposed.

Also, the overall surface of a wiring pattern of a circuit board used in the manufacturing process of the electronic component module according to the invention is covered with a thermoplastic resin coat.

According to such configuration, as the overall surface of the wiring pattern is covered with the thermoplastic resin coat in case the above-mentioned circuit board is used in the electronic component module manufacturing process, sealed structure satisfactory in moisture-proof and bonded structure high in tensile strength are acquired.

Also, in a circuit board manufacturing method according to the invention, thermoplastic resin is used as an etching mask used when a wiring pattern is formed by etching processing.

According to such configuration, as the etching mask used in the etching processing for forming the wiring pattern becomes a thermoplastic resin coat covering the overall surface of a conductive pattern as it is, a special coat formation process is not required and much labor is not required, and therefore the manufacture at a low cost can be realized.

Also, in a method of manufacturing an electromagnetic wave readable data carrier according to the invention, the body of a data carrier in which a metallic foil pattern composing an antenna coil is held on thin resin base material, and an electronic component module in which a bare semiconductor chip composing a send and receive circuit, a memory and others is mounted on a aluminum foil wiring pattern on the surface of thin resin base material are integrated.

In the electromagnetic wave readable data carrier manufacturing method, a process for manufacturing the electronic component module in which the bare semiconductor chip is mounted on the aluminum foil wiring pattern on the surface of the thin resin base material is mainly characteristic.

That is, in the process for manufacturing the electronic component module, a subprocess for pushing a melted thermoplastic resin coat aside by pressing a bump of the bare semiconductor chip on the melted thermoplastic resin coat applying an ultrasonic wave in a state in which the thermoplastic resin coat covering an electrode area on the aluminum foil wiring pattern is heated and melted and touching the bump and the electrode area, a subprocess for bonding the bump and the electrode area by continuously applying an ultrasonic wave in a state in which the bump and the electrode area are touched and a subprocess for cooling and solidifying the melted thermoplastic resin and bonding the body of the bare semiconductor chip on the circuit board are included.

Also, the overall surface of the aluminum foil wiring pattern of the circuit board according to the invention is covered with a thermoplastic resin coat.

Also, in the circuit board manufacturing method according to the invention, thermoplastic resin is used as an etching mask used when the aluminum foil wiring pattern is formed by etching processing.

In a preferred embodiment of the invention, for thermoplastic rein, polyolefin resin or polyester resin is used.

Action and effect can be desired by using such resin such that the resistance to a chemical satisfactory for an etching mask, and satisfactory junction strength between a metallic bump on the side of the semiconductor chip and a metallic electrode area on the side of the wiring pattern are acquired. That is, polyolefin resin is provided with satisfactory resistance to alkaline etchant such as NaOH or polyester resin is provided with satisfactory resistance to acid etchant such as $FeCl_2$. In addition, these resins are also excellent in an adhesive property.

Further, an electronic component module for an electromagnetic wave readable data carrier, according to the invention, comprises: a circuit board having a wiring pattern with an electrode area and a thermoplastic resin coat covering the electrode area of the wiring pattern; and a semiconductor chip mounted on the circuit board, said semiconductor chip having a bump at a side of the circuit board thereof. The bump of the semiconductor chip penetrates the thermoplastic resin coat and directly bonds with the electrode area of the wiring pattern.

In addition, an electromagnetic wave readable data carrier, according to the invention, comprises: a body of a data carrier including an insulating base material and a conductive pattern held on the insulating base material; and an electronic component module including a circuit board and a semiconductor chip mounted on the circuit board, said circuit board having a wiring pattern with an electrode area and a thermoplastic resin coat covering the electrode area of the wiring pattern, said semiconductor chip having a bump at a side of the circuit board thereof, the bump of the semiconductor chip penetrating the thermoplastic resin coat and directly bonding with the electrode area of the wiring pattern, wherein said electronic component module is manufactured by a method comprising: heating and melting the thermoplastic resin coat of said circuit board; pressing the bump of said semiconductor chip on the thus melted thermoplastic resin coat while applying an ultrasonic wave to the bump so that the bump penetrates the melted thermoplastic resin coat and brings into contact with electrode area; bonding the bump and the electrode area by continuously applying the ultrasonic wave to the bump bringing into contacted with the electrode area; and cooling and solidifying the melted thermoplastic resin coat so as to securely mount said semiconductor chip on said circuit board.

BRIEF DESCRIPTION OF THE DRAWINGS

FIGS. 1A–E are respectively process drawings for explaining a mounting method according to the invention;

FIG. 3 is a sectional view showing mounted structure by a method according to the invention;

FIG. 4 is a table showing the bonding strength of a semiconductor chip and a wiring pattern;

FIGS. 8A–E are respectively process drawings showing the manufacturing process of the electronic component module;

FIGS. 11A–E respectively show the manufacturing process of the electronic component module;

FIG. 13 is a table showing the result of the moisture-proof test of the thin data carrier to which the invention is applied;

DETAILED DESCRIPTION OF THE PREFERRED EMBODIMENTS

Figure 2A:
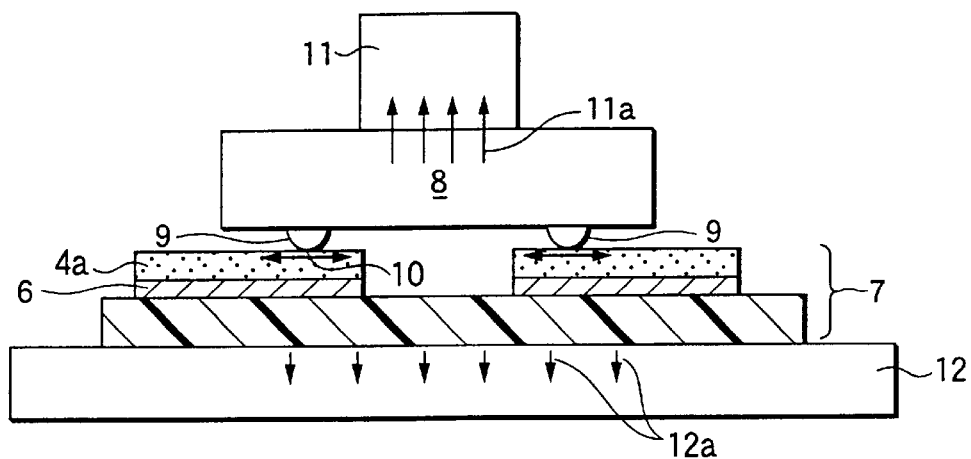
FIGS. 2A–C are respectively explanatory drawings showing the details of an ultrasonic mounting process.

Referring to the attached drawings, a suitable embodiment of a semiconductor chip mounting method according to the invention will be described in detail below.

As described above, the semiconductor chip mounting method according to the invention is provided with: 1) a process for pushing a heated and melted thermoplastic resin coat covering an electrode area on a wiring pattern aside by pressing a bump of a bare semiconductor chip on the melted thermoplastic resin coat applying an ultrasonic wave so as to bring the bump into contact with the electrode area; 2) a process for bonding the bump and the electrode area by continuously applying an ultrasonic wave in a state in which the bump and the electrode area are in contact; and 3) a process for cooling and solidifying the melted thermoplastic resin and bonding the body of the bare semiconductor chip on a circuit board.

An outline of a series of processes including such a mounting method is shown in a process drawing shown in FIGS. 1A–E. In this series of processes, a metallic foil lamination manufacturing process (A), an etching mask printing process (B), an etching process for forming a wiring pattern (C), an ultrasonic mounting process (D) and a bonding process (E) are included. The details of the processes will be described in order below.

[Metallic Foil Lamination Manufacturing Process (A)]

In this process, an Al-PET lamination 1 which is original material of a thin circuit board is manufactured. For example, the Al-PET lamination 1 is manufactured in a process for laminating hard aluminum foil 3 having the thickness of 35 $\mu$m on the single side (the upper surface in FIG. 1A) of a PET film 2 having the thickness of 25 $\mu$m via an urethane adhesive, and bonding them thermally under a condition of the temperature of 150° C. and the pressure of 5 kg/cm$^2$.

[Etching Mask Printing Process (B)]

In this process, an etching resist pattern 4 in the shape of a required wiring pattern is formed on the surface of the hard aluminum foil 3 of the Al-PET lamination 1. For example, the resist pattern 4 is formed by applying a polyolefin thermoplastic resin adhesive, which is melted at the temperature of approximately 150° C., on the surface of the hard aluminum foil 3 by approximately 4 to 6 $\mu$m in thickness by a method such as gravure. It is desirable that this thickness is varied according to the size and the shape of a bump of a mounted bare chip.

[Etching Process (C)]

In this process, a wiring pattern 6 composed of the hard aluminum foil 3 is formed by removing an aluminum foil part 5 exposed from the etching resist pattern 4 by well-known etching process. For example, the wiring pattern 6 is formed by exposing the aluminum foil part 5 exposed from the etching resist pattern 4 to NaOH (120 g/l) used as etchant under a condition of the temperature of 50° C. The wiring pattern 6 composed of the hard aluminum foil 3 appears on the surface of a circuit board 7 acquired in this etching process. The overall surface of the wiring pattern 6 is covered with the polyolefin thermoplastic resin adhesive used for the etching resist pattern (an etching mask) 4. In other words, the surface of at least an electrode area (an area to be connected with a bump of a bare semiconductor chip described later) of the wiring pattern 6 is covered with a thermoplastic resin coat 4a.

[Ultrasonic Mounting Process (D)]

In this process, a bare semiconductor chip 8 is mounted on the circuit board 7 applying an ultrasonic wave. This process includes: 1) a subprocess (a first subprocess) for pushing the melted thermoplastic resin coat 4a aside by pressing a bump 9 of the bare semiconductor chip 8 on the melted thermoplastic resin coat 4a in a state in which the thermoplastic resin coat 4a covering an electrode area 10 on the wiring pattern 6 is heated and melted applying an ultrasonic wave so as to bring the bump 9 into contact with the electrode area 10; and 2) a subprocess (a second subprocess) for bonding the bump 9 and the electrode area 10 in a state in which the bump 9 and the electrode area 10 are contacted with each other by continuously applying an ultrasonic wave.

The bare semiconductor chip 8 is composed as a so-called surface mounting-type component. That is, the bare semiconductor chip 8 has a body which has 150 $\mu$m thick and the bump 9 which is a metallic terminal for connection and protruded from the bottom of the bare semiconductor chip 8. In the first subprocess, the bump (made of gold for example) 9 is pressed on the thermoplastic resin coat 4a which is melted by heating at 150° C. in a state in which an ultrasonic wave is applied. Then, the melted thermoplastic resin coat 4a is pushed aside and removed from the position of the end of the bump 9 by the ultrasonic vibration of the bump 9. Further, an oxide layer and others on the surface of the aluminum foil wiring pattern 6 are also mechanically removed by the vibration. As a result, the bump 9 and the electrode area 10 are contacted with each other. In the second subprocess, afterward, the bump 9 and the electrode area 10 of the wiring pattern 6 are further heated by frictional heat by the vibration, a metallic fused part in which atoms of gold are diffused in the aluminum foil is formed and the bonding of both by an ultrasonic wave is completed.

The first and second subprocesses are completed by applying ultrasonic vibration of the frequency of 63 kHz by approximately a few seconds under the pressure of 0.2 kg/mm$^2$ for example after the bare semiconductor chip 8 is arranged in a predetermined position.

Figure 2B:
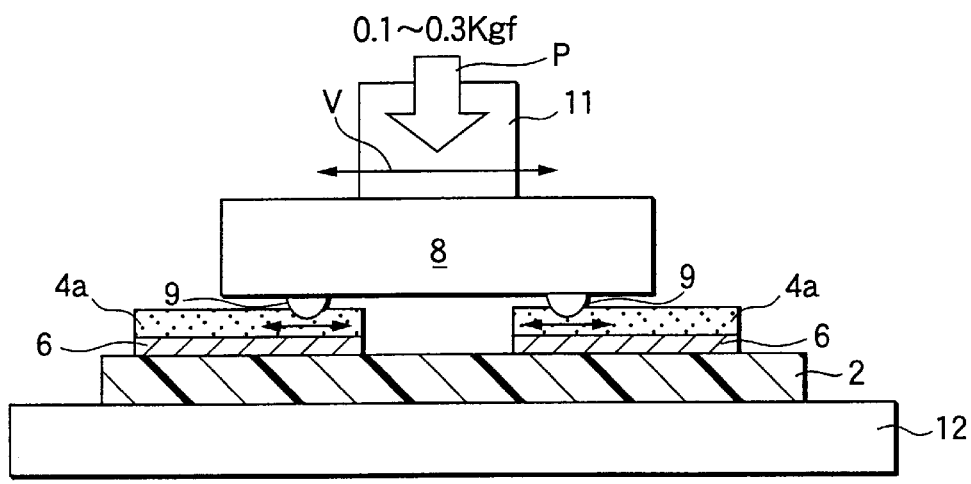
Figure 2C:
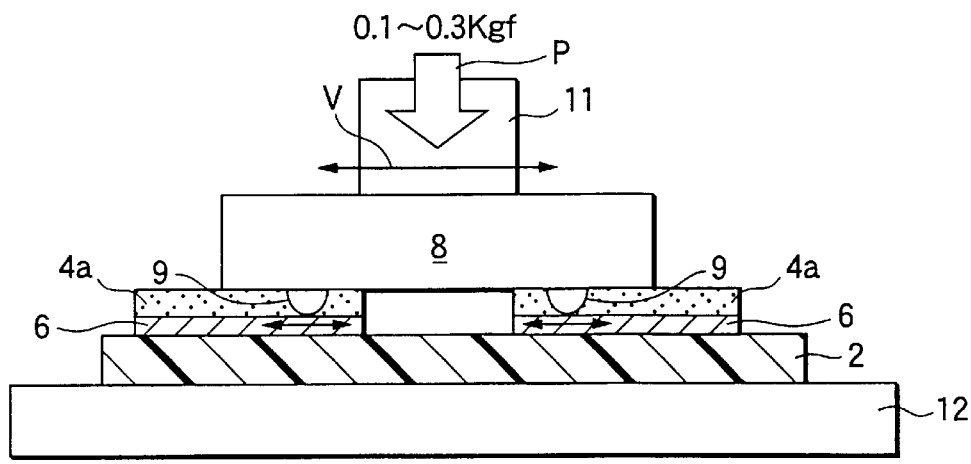

The details of the ultrasonic mounting process are shown in a process drawing shown in FIGS. 2A–C. In a positioning process shown in FIG. 2A, in a state in which an ultrasonic horn 11 and an anvil 12 used as a heater table respectively provided with a vacuum attraction function are arranged opposite, the bare chip 8 is attracted to the ultrasonic horn 11 as shown by an arrow 11a and the circuit board 7 is attracted to the anvil 12 as shown by an arrow 12a. In this state, the bump 9 on the side of the bare chip 8 and the electrode area 10 of the wiring pattern 6 on the side of the circuit board 7 are positioned, relatively moving the ultrasonic horn 11 and the anvil 12 in a horizontal direction. Simultaneously, the circuit board 7 is heated up to 150° C. by the anvil 12.

In a process for removing the thermoplastic resin adhesive shown in FIG. 2B, the melted thermoplastic resin coat 4a is pushed aside by pressing the bump 9 of the bare chip 8 on the thermoplastic resin adhesive (the thermoplastic resin coat) 4a in a heated and melted state by applying pressure (0.1 to 0.3 kgf) as shown by an arrow P, as applying ultrasonic vibration (63.5 kHz, 2 W) as shown by an arrow v by the ultrasonic horn 11 and the anvil 12. Therefore, the bump 9 and the electrode area 10 are contacted with each other.

In an ultrasonic bonding process shown in FIG. 2C, diffused junction between metals is accelerated by further continuously applying ultrasonic vibration v, and the bump 9 and the electrode area 10 are bonded.

Referring to FIGS. 1A–E again, the description will be continued.

[Bonding Process (E)]

In this process, the melted thermoplastic resin coat 4a is hardened again by natural cooling or forced cooling by removing the heat of 150° C. applied to the circuit board. Therefore, the bare semiconductor chip 8 and the wiring pattern 6 are bonded. That is, the thermoplastic resin coat 4a in a melted state filled between the bottom of the bare semiconductor chip 8 and the circuit board 7 is cooled and solidified, and the bare semiconductor chip 8 and the circuit board 7 are firmly bonded and fixed.

The mounted structure completed in the processes (A) to (E) is shown in FIG. 3. As shown in FIG. 3, according to this mounted structure, action and effect are acquired such that (1) sure electric conduction is acquired because the bump 9 and the electrode area 10 are bonded by diffused junction by an ultrasonic wave, (2) the moisture-proof is satisfactory because a junction between the bump 9 and the electrode area 10 is sealed with resin, (3) the mechanical strength of mounting for pulling and others is high because the semiconductor chip 8 and the circuit board 7 are bonded when the thermoplastic resin coat 4a is hardened, (4) electric conduction and mechanical coupling are simultaneously enabled in a short time, (5) the manufacturing cost is particularly low because special processes from sealing to bonding and adhesive material are not required and (6) the surface of the board is never more sticky than required in heating because no thermoplastic resin coat exists in a part in which the surface of the board is exposed.

The strength of bonding between the bare semiconductor chip 8 and the wiring pattern 6 in the case of the mounting method using the resin coat in this embodiment is shown in FIG. 4 in comparison with a case using only ultrasonic bonding. As clear from FIG. 4, in the case of the mounting method according to the invention, the double to triple strength of bonding is acquired, compared with the case of only ultrasonic bonding. It need scarcely be said that this is because the semiconductor chip 8 and the circuit board 7 are bonded when the thermoplastic resin coat 4a is hardened.

In the embodiment, the PET film 2 is used for resin base material composing the lamination 1, however, a polyimide film and others can be also used in place of the PET film.

Also, for the material of the etching resist pattern 4, polyester thermoplastic resin can be also used in place of the polyolefin resin. However, in that case, $FeCl_2$ is used for etchant.

For the circuit board 7 shown in FIG. 1C, the overall surface of the wiring pattern 6 is covered with the thermoplastic resin coat 4a and the circuit board can be generalized as a circuit board for flip-chip connection.

According to such configuration, as the overall surface of the wiring pattern 6 is covered with the thermoplastic resin coat 4a in case the circuit board is used for the above mounting method, sealed structure satisfactory in moisture-proof and bonded structure high in tensile strength are acquired. That is, the thermoplastic resin coat 4a located in the vicinity of the electrode area 10 on the wiring pattern 6 mainly contributes to sealing the ultrasonic junction, while the thermoplastic resin coat 4a located in a part except the electrode area contributes to the bonding of the body of the semiconductor chip 8 and the circuit board 7.

Also, in the circuit board manufacturing method shown in FIGS. 1B and 1C, thermoplastic resin is used for an etching mask used when the wiring pattern is formed by etching processing and the circuit board manufacturing method can be generalized as a method of manufacturing a circuit board for flip-chip connection.

According to such configuration, as the material of the etching mask used in etching processing for forming the wiring pattern becomes the thermoplastic resin coat covering the overall surface of a conductive pattern as it is, a coat formation process is not required and labor is not required. Therefore the manufacture at a low cost is realized.

Finally, the action and the effect of the semiconductor chip mounting method in this embodiment will be described together. That is, according to the above-mentioned mounting method, (1) in the wiring pattern formation process, the insulating resist used for etching processing is not required to be peeled in another process and the cost can be reduced.
(2) Further, the insulating resist made of thermoplastic resin functions as an adhesive immediately under the semiconductor chip and the strength for mounting the semiconductor chip by an ultrasonic wave can be reinforced.
(3) Also, the periphery of the bump can be sealed with resin material and the reliability in moisture-proof of the bump connection can be enhanced.
(4) The resin material for the above-mentioned purpose required in a related art type method is not required and the cost of the material can be reduced.
(5) Secure connection between terminals is acquired by the diffused junction by ultrasonic vibration of metal between the bump and the wiring pattern.
(6) The ultrasonic junction, the melting of the thermoplastic resin and the hardening of the thermoplastic resin can be executed within 1 to 2 seconds and the manufacturing time can be reduced.

Next, referring to FIGS. 5 to 10C, an embodiment of a data carrier manufacturing method according to the invention will be described. This data carrier functions as a flight tag, a label for physical distribution management, a ticket for an unmanned wicket and others and can read an electromagnetic wave. This data carrier is composed by integrating the body of the data carrier with an electronic component. In the body of the data carrier, a metallic foil pattern composing an antenna coil is held on thin resin base material. In the electronic component module, a bare semiconductor chip composing a send and receive circuit, a memory and others is mounted on an aluminum foil wiring pattern on the surface of the thin resin base material.

Figure 5:
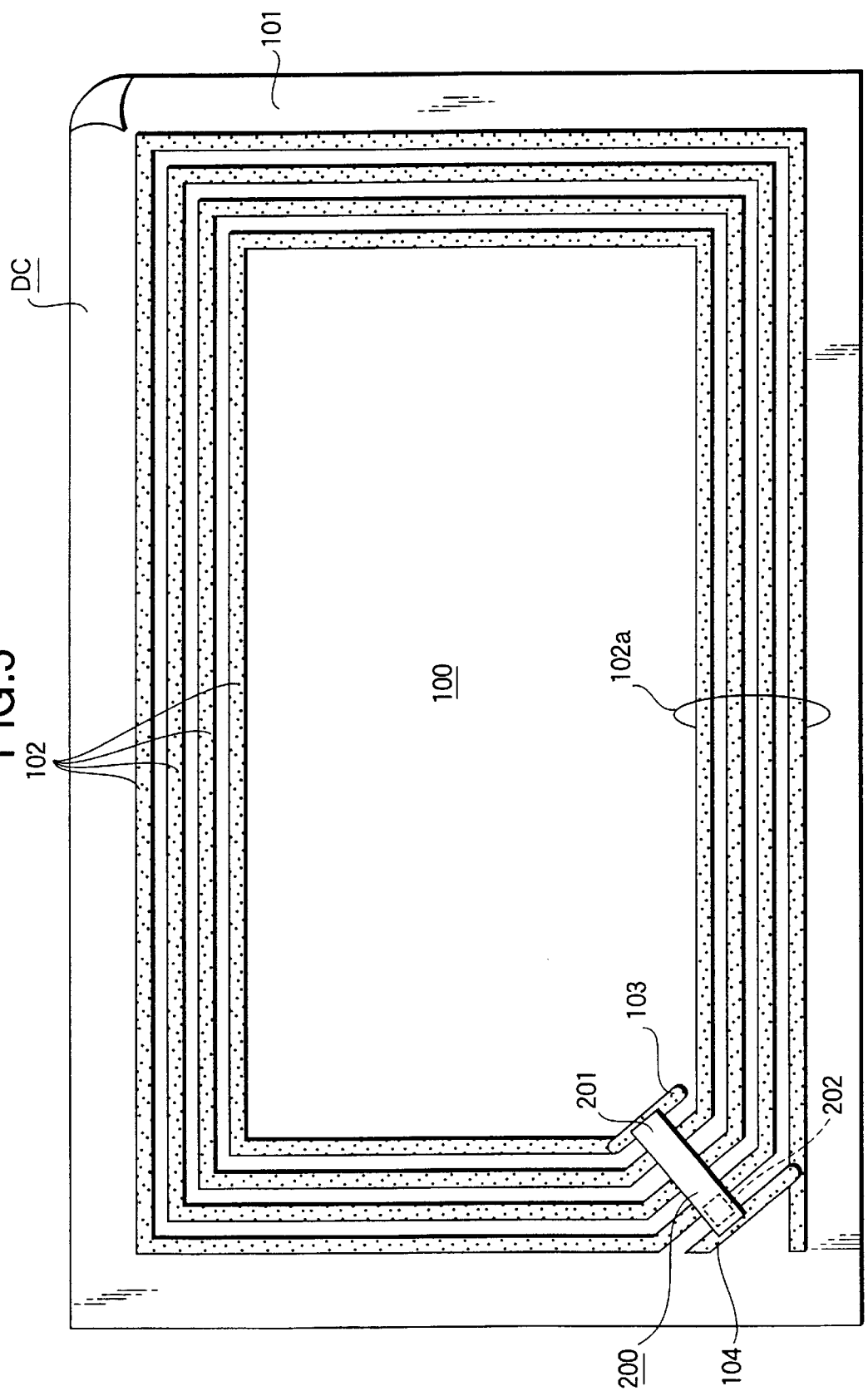
FIG. 5 is a front view showing an example of a data carrier.

An example of the embodiment of the data carrier is shown in FIG. 5. As shown in FIG. 5, the data carrier DC is provided with the body of the data carrier 100 and an electronic component module 200. In the body of the data carrier 100, a copper foil curled conductive pattern (equivalent to an antenna coil) 102 having the thickness of 10 $\mu$m is held on the single side of polyethylene terephthalate (PET) base material 101 having the thickness of 25 $\mu$m. In the electronic component module 200, bare chip IC 202 is mounted on the lower side in FIG. 5 of a glass epoxy piece 201 having the thickness of 70 $\mu$m. The electronic component module 200 is mounted on the body of the data carrier 100 so that the piece 201 crosses an orbital conductive flux 102a composing the curled conductive pattern 102. Electric connection of the electronic component module 200 with the curled conductive pattern 102 is performed in a terminal pad on the inner side 103 and in a terminal pad on the outer side 104 of the curled conductive pattern 102.

Figure 6:
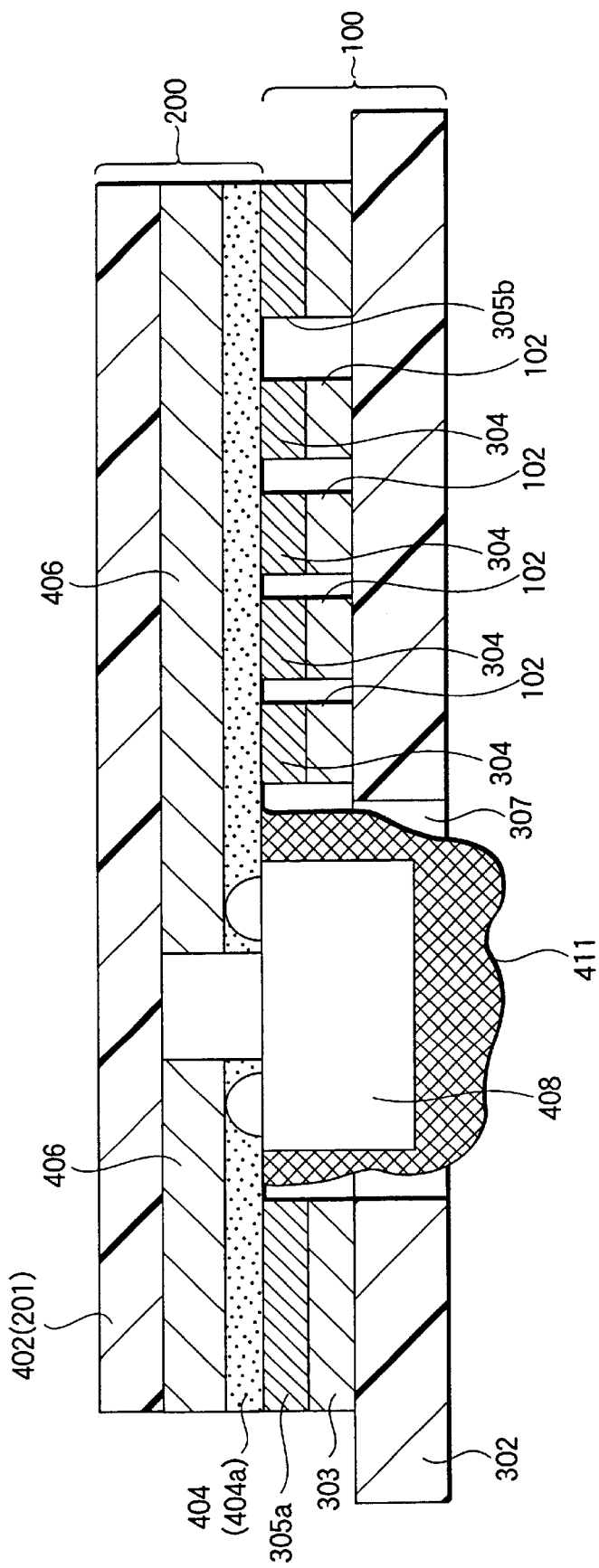
FIG. 6 is a sectional view showing a lamination of the body of the data carrier and an electronic component module.

An example of the structure in which the electronic component module 200 is mounted is shown in an enlarged sectional view in FIG. 6. A method of manufacturing the body of the data carrier 100 and the electronic component module 200 respectively shown in FIGS. 5 and 6 will be sequentially described in detail below.

An example of the manufacturing process of the curled conductive pattern 102 composing an antenna coil is shown in FIGS. 7A–E. Referring to FIGS. 7A–E, a process when the curled conductive pattern 102 to be an antenna coil is formed on the single side of the PET film base material 101 will be described.

Figure 7A:
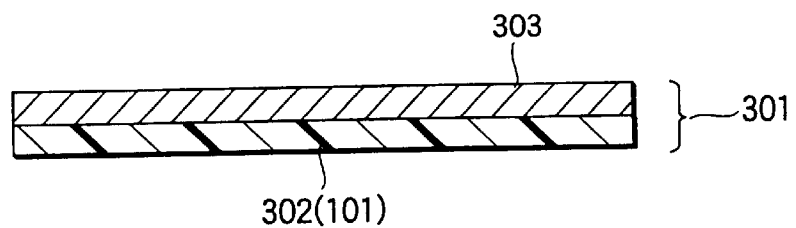
FIGS. 7A–E are respectively process drawings showing the manufacturing process of the body of the data carrier.

(Process A As Shown in FIG. 7A)

First, a Cu-PET lamination 301 is prepared. For example, copper foil 303 having the thickness of 10 μm is laminated on the single side of a PET film 302 having the thickness of 25 μm via an urethane adhesive. Then they is thermically bonded under a condition of the temperature of 150° C. and the pressure of 5 kg/cm². Hereby, the Cu-PET lamination 301 in which the cupper foil 303 is bonded on the surface of the PET film 302 is completed.

Figure 7B:
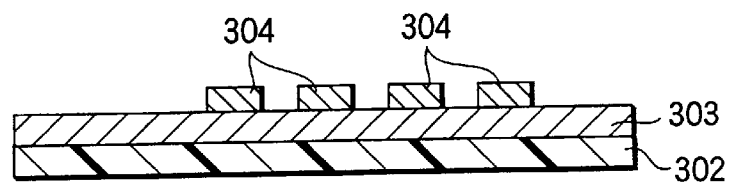

(Process B As Shown in FIG. 7B)

Next, a curled etching resist pattern 304 is formed on the surface of the copper foil 303 of the Cu-PET lamination 301. That is, insulating etching resist ink is printed on the copper foil 303 using an offset printing method for example so that the insulating etching resist ink has a curled shape having the number of turns, the width, the pitch and the inside and outside circumferences for acquiring an L value and a Q value respectively required for the characteristics of a coil. For the resist ink at this time, a type hardened by heat or an active energy beam is used. For the active energy beam, ultraviolet rays or an electron beam is used. In case ultraviolet rays are used, the resist ink including a photopolymerization agent and is used.

Figure 7C:
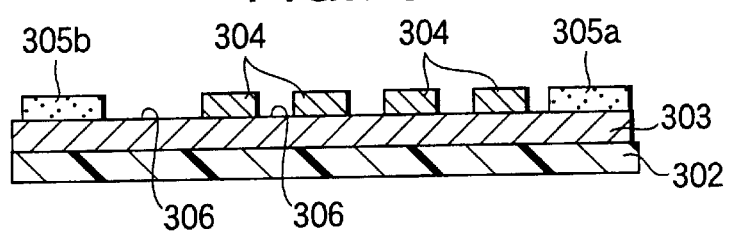

(Process C As Shown in FIG. 7C)

Next, conductive etching resist patterns 305a and 305b (103 and 104 in FIG. 5) in the shape of a required electrode are formed by conductive ink in a position for electric connection with the electrode of the electronic component module 200 on the surface of the copper foil 303 of the Cu-PET lamination 301. These resist patterns 305a and 305b are formed by off set printing as in the above-mentioned process. For resist ink, a thermosetting conductive adhesive hardened by heat treatment at 120° C. for approximately 20 minutes is used. A screen printing method generally performed may be also used for the printing of conductive ink in this process. For ink material, a chemical acquired by adding a photopolymerization agent to the mixture of Ag particles and an thermoplastic adhesive for example or solder paste and others may be also used.

Figure 7D:
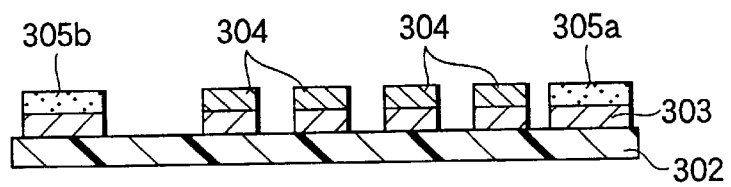

(Process D As Shown in FIG. 7D)

Next, a copper foil part 306 exposed from the etching resist patterns 304, 305a and 305b is removed by executing well-known etching and a curled conductive pattern (102 in FIG. 5) to be an antenna coil is formed. In this etching processing, FeCl₂ (120 g/l) is used for etchant under a condition of the temperature of 50° C. and the copper foil 303 is removed. Afterward, generally, unless the etching resist formed in the process B is removed, an electronic component cannot be mounted on a circuit, that is, on a curled pattern composing an antenna coil. In the present invention, however, as described in relation to the process C, the conductive resist patterns 305a and 305b are provided and etching resist is not required to be removed by mounting an electronic component in this position. That is, a process for peeling the etching resist can be omitted by the invention. Further, there is also effect that the etching resist 304 formed by insulating ink also functions as an insulating protective layer on the surface of the copper foil circuit pattern.

Figure 7E:
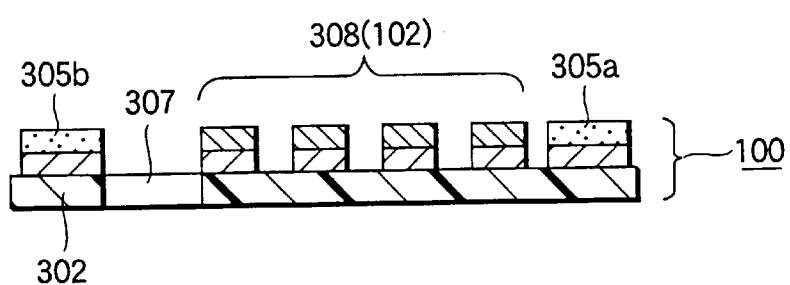

(Process E As Shown in FIG. 7E)

Finally, in this embodiment, a transparent hole 307 into which a convex portion(a potting part 411) described later of the electronic component module can be inserted is formed by a press process. As a result, the body of the data carrier 100 in which the curled conductive pattern 308 (102) to be an antenna coil is held on the single side of the PET film base material 302 (101) is completed.

Next, an example of the manufacturing process of the electronic component module 200 is shown in FIGS. 8A–E. The contents shown in FIGS. 8A–E are the same as the contents described above referring to FIGS. 1A–E except that a bare chip 408 is sealed with resin in the potting part 411 in a final process and conductive resist 412 is arranged in an electrode part for connection with the body of the data carrier 100.

[Metallic Foil Lamination Manufacturing Process (A)]

In this process, an Al-PET lamination 401 which is the base material of a thin circuit board is manufactured. For example, the Al-PET lamination 401 is manufactured in a process for laminating hard aluminum foil 403 having the thickness of 35 μm on the single side (the upper surface in FIG. 8A) of a PET film 402 having the thickness of 25 μm via an urethane adhesive and thermically bonding them under a condition of the temperature of 150° C. and the pressure of 5 kg/cm².

[Etching Mask Printing Process (B)]

In this process, an etching resist pattern 404 in the shape of a required wiring pattern is formed on the surface of the hard aluminum foil 403 of the Al-PET lamination 401. For example, the resist pattern 404 is formed by applying a polyolefin thermoplastic resin adhesive, which is melted at the temperature of approximately 150° C., on the surface of the hard aluminum foil 403 by approximately 4 to 6 μm in thickness by a method such as gravure. It is desirable that the applied thickness is adjusted according to the size and the shape of a bump of a mounted bare chip. In addition, in this process, conductive etching resist patterns 412a and 412b in the shape of a required electrode pattern are arranged in each connection with terminal pads 305a and 305b of the body of the data carrier 100. These resist patterns 412a and 412b are formed by offset printing as in the above-mentioned process. For resist ink, a thermosetting conductive adhesive hardened by heat treatment at 120° C. for approximately 20 minutes is used. For the printing of conductive ink in this process, screen printing generally performed may be also used. For ink material, a chemical in which a photopolymerization agent is added to the mixture of Ag particles and an thermoplastic adhesive for example or solder paste and others may be also used.

[Etching Process (C)]

In this process, a wiring pattern 406 made of hard aluminum foil 403 is formed by removing an aluminum foil part 405 exposed from the etching resist pattern 404 by well-known etching processing. For example, this wiring pattern 406 is formed by exposing the aluminum foil part 405 exposed from the etching resist pattern 404 to NaOH (120 g/l) which is etchant under a condition of the temperature of 50° C. The wiring pattern 406 made of hard aluminum foil 403 appears on the surface of a circuit board 407 acquired in this etching process. Also, the overall surface of the wiring pattern 406 is covered with the polyolefin thermoplastic resin adhesive used for the etching resist pattern (an etching mask) 404. In other words, the surface of at least the electrode area (an area to be connected with the bump of the bare semiconductor chip described later) of this wiring pattern 406 is covered with a thermoplastic resin coat 404a.

[Ultrasonic Mounting Process (D)]

In this process, the bare semiconductor chip 408 is mounted on the circuit board 407 applying an ultrasonic wave. This process includes: 1) a first subprocess for pushing the melted thermoplastic resin coat 404a aside by pressing a bump 409 of the bare semiconductor chip 408 on the melted thermoplastic resin coat 404a applying an ultrasonic wave in a state in which the thermoplastic resin coat 404a covering an electrode area 410 on the wiring pattern 406 is heated and melted so as to bring the bump 409 into contact with the electrode area 410 and 2) a second subprocess for bonding the bump 409 and the electrode area 410 by continuously applying an ultrasonic wave in a state in which the bump 409 and the electrode area 410 are contacted with each other.

The bare semiconductor chip 408 is composed as a so-called surface mounting-type component. That is, the bare semiconductor chip 408 has a body which is 150 μm thick and the bump 409 which is a metallic terminal for connection and protruded form the bottom of the bare semiconductor 408. In the first subprocess, the bump (made of gold for example) 409 is pressed on the thermoplastic resin coat 404a which is melted by heating at 150° C. applying ultrasonic vibration. Then, the melted thermoplastic resin coat 404a is pushed aside and removed from the end position of the bump 409 by the ultrasonic vibration of the bump 409. Further, anoxide layer and others on the surface of the aluminum foil wiring pattern 406 are also mechanically removed by the vibration. As a result, the bump 409 and the electrode area 410 are contacted with each other. In the second subprocess, afterward, the bump 409 and the electrode area 410 of the wiring pattern 406 are heated by frictional heat by the vibration further, a metallic fused part in which atoms of gold are diffused in the aluminum foil is formed and the ultrasonic junction of both is completed.

The first and second subprocesses are completed by applying ultrasonic vibration at the frequency of 63 kHz for approximately a few seconds under the pressure of 0.2 kg/mm² for example after the bare semiconductor chip 408 is arranged in a predetermined position.

[Bonding Process (E)]

In this process, the melted thermoplastic resin coat 404a is rehardened by natural cooling or forced cooling by removing the heat of 150° C. applied to the circuit board, and the body of the bare semiconductor chip 408 and the wiring pattern 406 are bonded. That is, the melted thermoplastic resin coat 404a filled between the bottom of the bare semiconductor chip 408 and the circuit board 407 is cooled and solidified, and the bare semiconductor chip 408 and the circuit board 407 are firmly bonded and fixed. Afterward, the bare semiconductor chip 408 is sealed with resin by a well-known method if necessary and the potting part 411 is formed.

Next, referring to FIGS. 9A–B, a procedure for mounting the electronic component module 200 on the body of the data carrier 100 so that its insulating piece 201 crosses the orbital conductive flux 102a composing the curled conductive pattern 102 and electrically connecting with the curled conductive pattern separately on the inside and the outside of the curled conductive pattern 102 will be described.

Figure 9A:
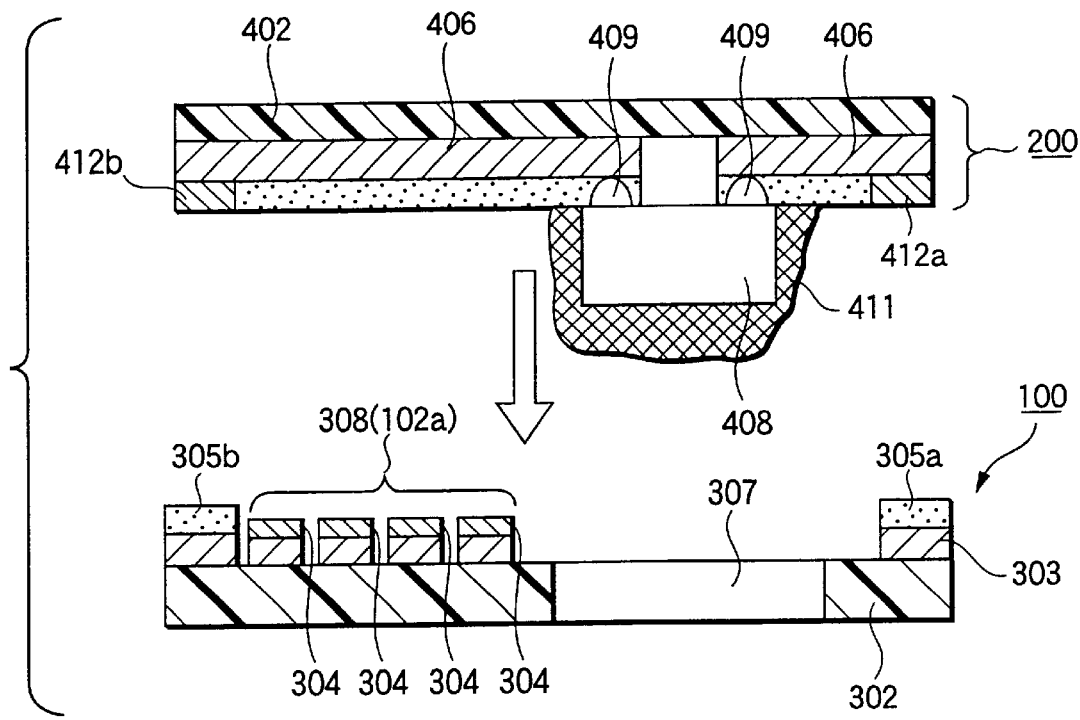
FIGS. 9A–B are respectively process drawings showing processes for mounting the electronic component module on the body of the data carrier.

(Process A As Shown in FIG. 9A)

First, the electronic component module 200 is mounted on the body of the data carrier 100 so that the electronic component mounted side of the electronic component module 200 and the conductive pattern formation side of the body of the data carrier 100 are opposite, and the electronic component module 200 crosses the orbital conductive flux 102a composing the curled conductive pattern 102. At this time, the potting part 411 covering the bare chip 408 which is an electronic component is inserted into the hole 307 made on the side of the body of the data carrier 100. Further, the conductive resist areas 412a and 412b to be electrode areas of a pair of aluminum foil areas 406 connected to the bumps 409 of the bare chip 408 on the side of the electronic component module 200 are respectively located over a pair of conductive resist patterns 305a and 305b on the side of the body of the data carrier 100. That is, the copper foil areas 406 on the side of the electronic component module 200 and the conductive resist patterns 305a and 305b on the side of the body of the data carrier 100 are respectively opposite via the conductive resist areas 412.

Figure 9B:
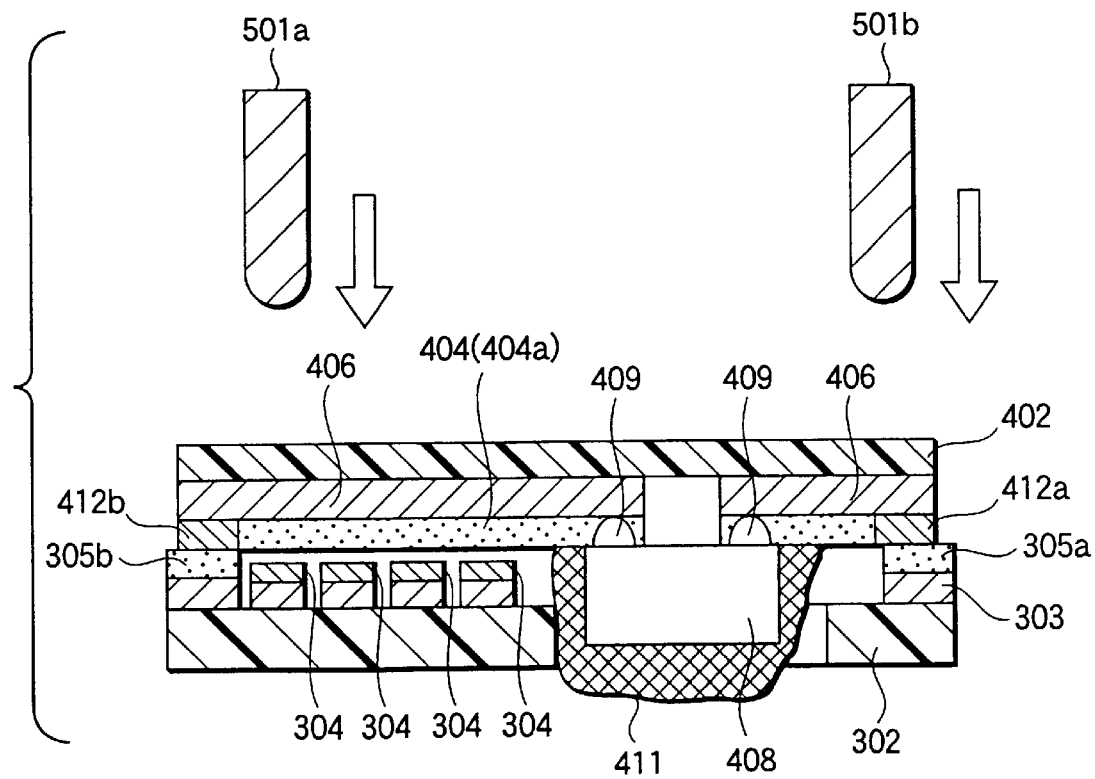

(Process B As Shown in FIG. 9B)

Next, indentators 501a and 501b heated up to 160° C. are pressed particularly on a pair of conductive resist patterns 305a and 305b at the pressure of 21.7 kg for 20 seconds from over the electronic component module 200. At this time, the conductive resist pattern which is a thermoplastic adhesive coat is locally softened and melted, and the conductive resist areas 412a and 412b that respectively conduct to the terminal areas 406 of the electronic component module 200 and the conductive resist patterns 305a and 305b on the side of the body of the data carrier 100 are respectively bonded and fixed. In the meantime, as the thermoplastic resin coat 404a can be utilized for the junction of the electronic component module 200 and the body of the data carrier 100 with the thermoplastic resin coat keeping insulation. Further, the etching resist 304 on the surface of the curled conductive pattern 102 is left as insulating material. Therefore, a wiring pattern (not shown) on the insulating base material piece 402 (201) of the electronic component module 200 also functions as a jumper member mating the inside and the outside of the curled conductive pattern 102. As a result, the curled conductive pattern 102 and the bare chip 408 can be electrically connected without using a jumper member, a back wiring pattern and others as in related art type structure.

Next, referring to FIGS. 10A to 12B, another embodiment of the data carrier manufacturing method according to the invention will be described. This data carrier also functions as a flight tag, a label for physical distribution management, a ticket for an unmanned wicket and others and can also read an electromagnetic wave. This data carrier is also composed by integrating the body of a data carrier with electronic component module on the surface of the thin resin base material as in the embodiment described referring to FIG. 5. In the body of a data carrier, a metallic foil pattern composing an antenna coil is held on thin resin base material. In the electronic component module, a bare semiconductor chip composing a send and receive circuit, a memory and others is mounted on an aluminum foil wiring pattern.

Figure 10A:
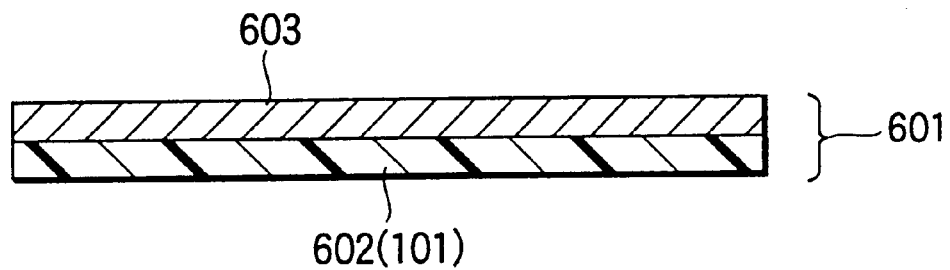
FIGS. 10A–C respectively show the manufacturing process of the body of the data carrier.
Figure 10B:
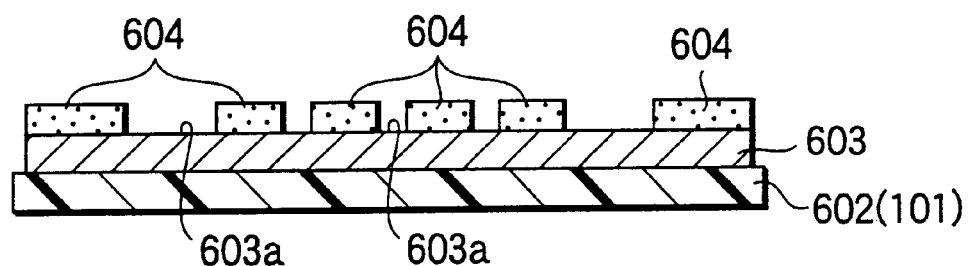
Figure 10C:
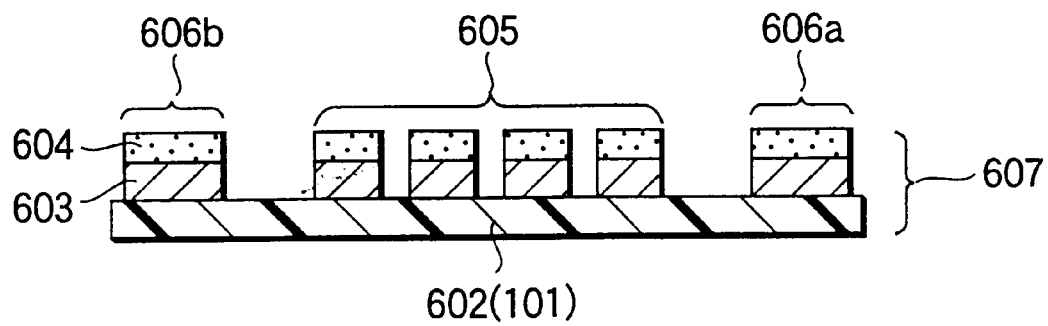

An example of the manufacturing process of the curled conductive pattern 102 shown in FIG. 5 composing an antenna coil is shown in FIGS. 10A–C. Referring to FIGS. 10A–C, processes when the curled conductive pattern 102 shown in FIG. 5 to be an antenna coil is formed on the single side of the PET film base material 101 as shown in FIG. 5 will be described below.

(Process A As Shown in FIG. 10A)

First, Cu-PET lamination base material 601 is prepared. For example, copper foil having the thickness of 10 μm is laminated on the single side of a PET film having the thickness of 25 μm via an urethane adhesive and is thermically bonded under a condition of the temperature of 150° C. and the pressure of 5 kg/cm². Hereby, the Cu-PET lamination 601 in which the cupper foil 603 is bonded on the surface of the PET film 602 (101) is completed.

(Process B As Shown in FIG. 10B)

Next, a curled etching resist pattern 604 and an etching resist pattern 604 in the shape of a terminal are formed on the surface of the copper foil 603 of the Cu-PET lamination 601. That is, insulating etching resist ink is printed on the copper foil using an offset printing method for example so that the insulating etching resist ink has a curled shape having the number of turns, the width, the pitch and the inside and outside circumferences for acquiring an L value and a Q value respectively required for the characteristics of a coil. For the resist ink at this time, a type hardened by heat or an active energy beam is used. For the active energy beam, ultraviolet rays or an electron beam is used and in case ultraviolet rays are used. In this case, the resist ink including a photopolymerization agent is used.

(Process C As Shown in FIG. 10C)

A curled conductive pattern 605 and terminal pads 606a and 606b on the inside and outside circumferences respectively composing an antenna coil are formed by removing a copper foil part 603a exposed from the etching resist pattern 604 formed in the above-mentioned process by well-known etching. In this etching processing, $FeCl_2$ (120 g/l) is used for etchant under a condition of the temperature of 50° C. and the required copper foil (Cu) is removed.

Afterward, generally, unless the insulating etching resist 604 formed in the process B is removed, an electronic component cannot be mounted on a circuit, that is, on a coil. In the invention, however, as the etching resist located in parts to be bonded 606a and 606b is removed by mechanical friction by an ultra sonic wave in junction described later, the insulating resist 604 is not required to be removed. That is, according to the invention, a process for peeling the etching resist 604 can be omitted. Further, effect is acquired such that the etching resist 604 can be used for an insulating protective layer on the surface of the copper conductive pattern 605.

Next, an example of a process for producing the electronic component module 200 is shown in FIGS. 11A–E.

[Metallic Foil Lamination Manufacturing Process (A)]

In this process, an Al-PET lamination 701 which is original material of a thin circuit board is manufactured. For example, the Al-PET lamination 701 is manufactured in a process for laminating hard aluminum foil 703 having the thickness of 35 μm on the single side (the upper surface in FIGS. 11 A–E) of a PET film 702 having the thickness of 25 μm via an urethane adhesive and bonding them thermally under a condition of the temperature of 150° C. and the pressure of 5 kg/cm².

[Etching Mask Printing Process (B)]

In this process, an etching resist pattern 704 in the shape of a required wiring pattern is formed on the surface of the hard aluminum foil 703 of the Al-PET lamination 701. For example, the resist pattern 704 is formed by applying a polyolefin thermoplastic resin adhesive, which is melted at the temperature of approximately 150° C., on the surface of the hard aluminum foil 703 by approximately 4 to 6 μm in thickness by a method such as gravure. It is desirable that this thickness is varied according to the size and the shape of a bump of a mounted bare chip.

[Etching Process (C)]

In this process, a wiring pattern 706 made of the hard aluminum foil 703 is formed by removing an aluminum foil part 705 exposed from the etching resist pattern 704 by well-known etching processing. For example, the wiring pattern 706 is formed by exposing the aluminum foil part 705 exposed from the etching resist pattern 704 to NaOH (120 g/1) which is etchant under a condition of the temperature of 50° C. The wiring pattern 706 made of the hard aluminum foil 703 is formed on the surface of a circuit board 707 acquired in this etching process. The overall surface of the wiring pattern 706 is covered with the polyolefin thermoplastic resin adhesive used for the etching resist pattern (an etching mask) 704. In other words, the surface of at least an electrode area (an area to be connected with a bump of a bare semiconductor chip described later) of the wiring pattern 706 is covered with a thermoplastic resin coat 704a.

[Ultrasonic Mounting Process (D)]

In this process, a bare semiconductor chip 708 is mounted on the circuit board 707 applying an ultrasonic wave. This process includes: 1) a subprocess (a first subprocess) for pushing the melted thermoplastic resin coat 704a aside by pressing a bump 709 of the bare semiconductor chip 708 on the melted thermoplastic resin coat 704a in a state in which the thermoplastic resin coat 704a covering an electrode area 710 on the wiring pattern 706 is heated and melted applying an ultrasonic wave so as to bring the bump 709 into contact with the electrode area 710; and 2) a subprocess (a second subprocess) for bonding the bump 709 and the electrode area 710 in a state in which the bump 709 and the electrode area 710 are contacted with each other by continuously applying an ultrasonic wave.

The bare semiconductor chip 708 is composed as a so-called surface mounting-type component. That is, the bare semiconductor chip 708 has a body which is 150 μm thick and the bump 709 which is a metallic terminal for connection and protruded form the bottom of the bare semiconductor chip 708. In the first subprocess, the bump (made of gold for example) 709 is pressed on the thermoplastic resin coat 704a which is melted by heating at 150° C. applying an ultrasonic wave. Then, the melted thermoplastic resin coat 704a is pushed aside and removed from the position of the end of the bump 709 by the ultrasonic vibration of the bump 709. Further, an oxide layer and others on the surface of the aluminum foil wiring pattern 706 are also mechanically removed by the vibration. As a result, the bump 709 and the electrode area 710 are contacted with each other. In the second subprocess, afterward, the bump 709 and the electrode area 710 of the wiring pattern 706 are further heated by frictional heat by the vibration, a metallic fused part in which atoms of gold are diffused in the aluminum foil is formed and the bonding of both by an ultrasonic wave is completed.

The first and second subprocesses are completed by applying ultrasonic vibration of the frequency of 63 kHz by approximately a few seconds under the pressure of 0.2 kg/mm² for example after the bare semiconductor chip 708 is arranged in a predetermined position.

[Bonding Process (E)]

In this process, the melted thermoplastic resin coat 704a is hardened again by natural cooling or forced cooling by removing the heat of 150° C. applied to the circuit board, and the body of the bare semiconductor chip 708 and the wiring pattern 706 are bonded. That is, the thermoplastic resin coat 704a in a melted state filled between the bottom of the bare semiconductor chip 708 and the circuit board 707 is cooled and solidified, and the bare semiconductor chip 708 and the circuit board 707 are firmly bonded and fixed. Afterward, the bare semiconductor chip 708 is sealed with resin by a well-known method if necessary and a potting part 711 is formed. As a result, an electronic component module 707 is completed.

Next, referring to FIGS. 12A–B, a process for mounting the electronic component module 707 on the data carrier 607 and electrically connecting with an antenna coil will be described. This process is executed using ultrasonic welding technology.

Figure 12A:
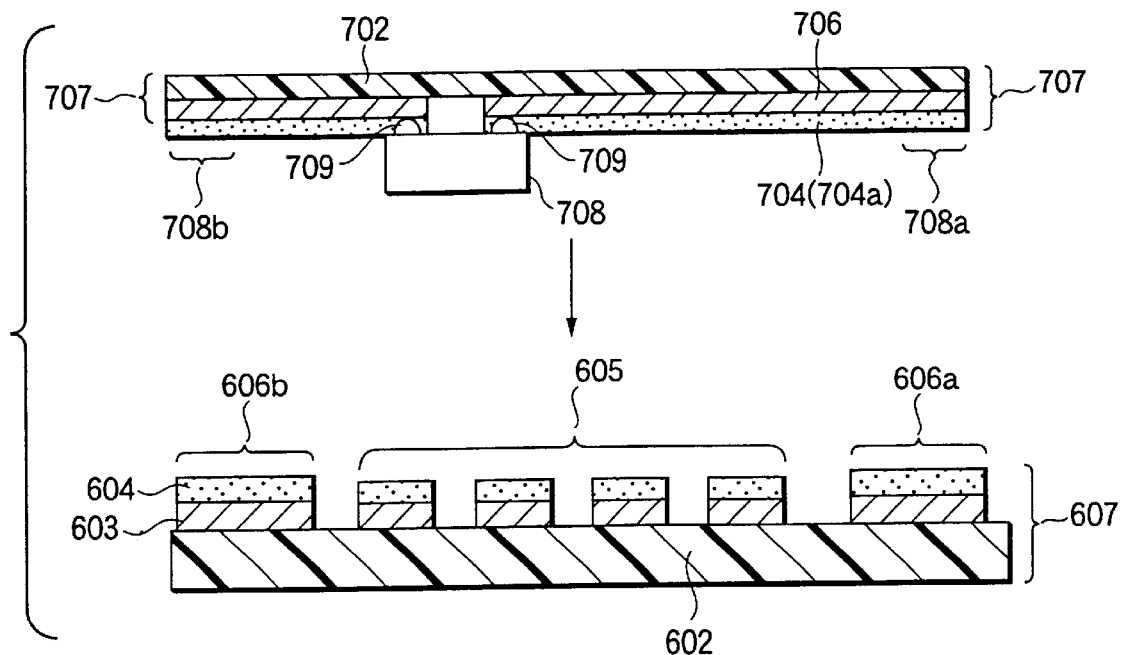
FIGS. 12A–B are respectively process drawings showing a process for mounting the electronic component module on the body of the data carrier.

(Process A As Shown in FIG. 12A)

First, the electronic component module 707 is mounted on the body of the data carrier 607 in a matched state that parts to be bonded 708a and 708b on the side of the electronic component and terminal pads 606a and 606b which are parts to be bonded on the side of the body of the data carrier are opposite.

(Process B As Shown in FIG. 12 B)

Next, a pair of indentators 801 and 802 that fall integrally are pressed over the parts to be bonded 708a and 708b of the electronic component module 707 by time T (approximately 0.5 second) applying the ultrasonic vibration of applied pressure P (0.2 kg/mm²) and a frequency V (40 kHz). Reference numbers 803 and 804 denote anvils arranged opposite to the indentators 801 and 802.

Generally, welding is caused by bringing atoms at distance (a few angstrom (Å)) at which attraction is exerted between atoms on the surfaces of metals to be bonded and contacting with the surfaces with atoms on the overall surfaces orderly arrayed. However, normally, as the surface of metal is covered with a thin superficial layer such as oxide and absorbed gas, the approach of clean metallic atoms under it is prevented and sufficient bonding power is not caused.

In this ultrasonic bonding method, the terminal of the electronic component module and the terminal on the side of the antenna coil are bonded and fixed by removing a metallic superficial layer by ultrasonic vibration by the above-mentioned method, further activating the vibration of atoms and diffusing atoms.

Figure 12B:
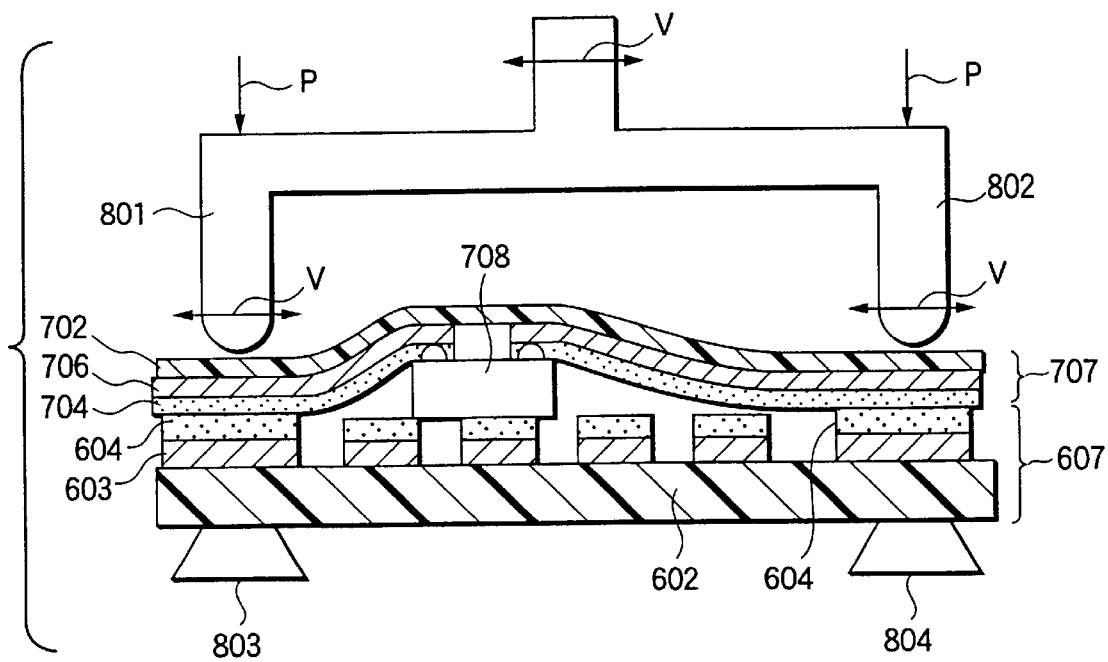
Figure 14:
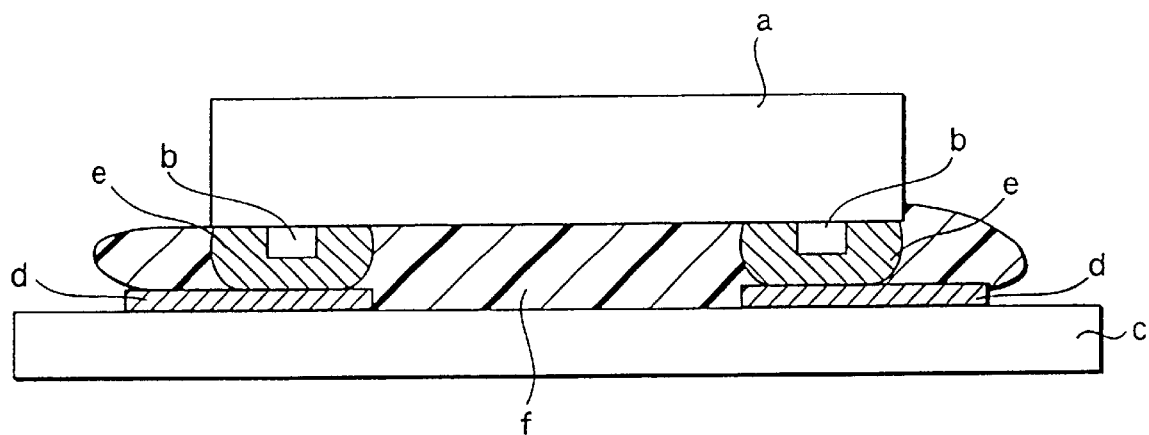
FIG. 14 shows a first related art type method of flip-chip connection.
Figure 15:
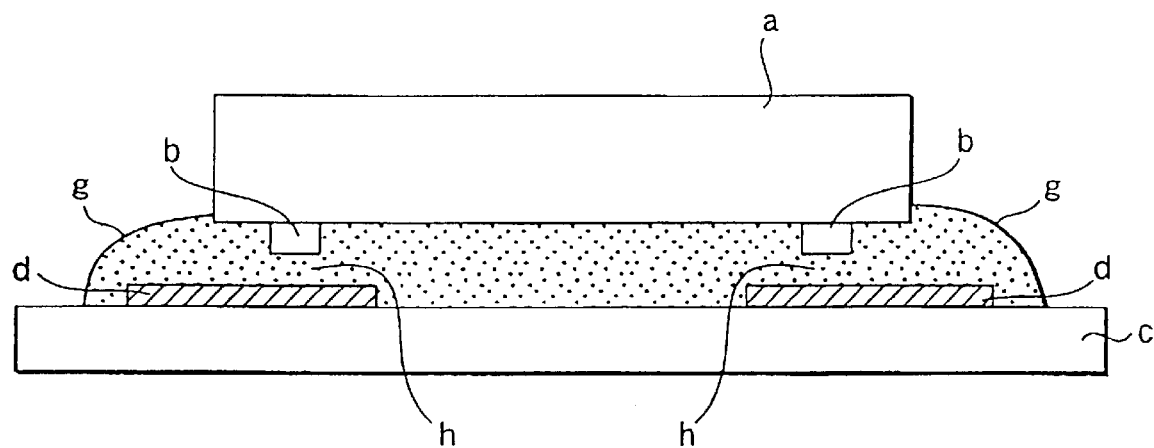
FIG. 15 shows a second related art type method of flip-chip connection.

Further, this method is based upon a principle that bonding is realized by removing a metallic superficial layer by ultrasonic vibration as described above and even if the bonding process is executed in a state in which insulating etching resist 704 formed on the terminal pads 606a and 606b of the conductive pattern is not peeled as shown in the process (B) in FIG. 12B, a sufficient electric and mechanical bonding characteristic is acquired between the side of the electronic component module 707 and the side of the body of the data carrier 607. The thin data carrier DC (see FIG. 5) according to the invention is completed by the processes described above.

In the above-mentioned embodiments, the plastic flow of metal is locally caused corresponding to the protruded part by providing multiple irregularities corresponding to the shape of the fused part to the end face of the anvils 803 and 804 opposite to the indentators 801 and 802 for example and in the meantime, adjusting the pressing time of the indentators 801 and 802 and resin layers exposed from a part from which a metallic layer is removed can be fused by ultrasonic vibration. Particularly, as the mechanical bonding strength of the electronic component module is particularly enhanced in case such fusion of metal and the fusion of resin are both used, the data carrier is effective when it is often roughly handled as a flight tag and a label for physical distribution management.

As the thin data carrier completed as described above uses an electromagnetic field as a read medium, it can securely read data stored in the semiconductor chip apart by the distance of 100 to 1000 mm without being restricted by distance and a direction in reading so much, concretely without being restricted by the direction of reading.

The result of the moisture-proof test (at the temperature of 85° C. and at the humidity of 85%) of the thin data carrier manufactured in this embodiment is shown in FIG. 13. As shown in FIG. 13, the variation of communication distance after 250 hours elapse in the moisture-proof test is within ±10%. It is verified that for reliability on the moisture-proof of the connection of the bump, a sufficient value is acquired.

As clear from the description, according to the invention, the semiconductor chip mounting method by the flip-chip connection method in which the semiconductor chip can be mounted on the circuit board promptly, electrically and mechanically securely and further, at a low cost can be provided.

Also, according to the invention, the electromagnetic wave readable data carrier manufacturing method in which the electromagnetic wave readable data carrier that functions as a flight tag, a label for physical distribution management, a ticket for an unmanned wicket and others can be produced at a low cost in a mass can be provided.

What is claimed is:

1. A method of mounting a semiconductor chip on a circuit board, said semiconductor chip having a terminal bump, said circuit board having a wiring pattern with an electrode area and a thermoplastic resin coat covering the electrode area of the wiring pattern, said method comprising the steps of:

heating and melting the thermoplastic resin coat of said circuit board;

pressing the terminal bump of said semiconductor chip on the thus melted thermoplastic resin coat while applying an ultrasonic wave to the terminal bump so that the terminal bump penetrates the melted thermoplastic resin coat and comes into contact with the electrode area;

bonding the terminal bump and the electrode area by continuously applying an ultrasonic wave to the terminal bump while in contact with the electrode area; and cooling and solidifying the melted thermoplastic resin coat so as to securely mount said semiconductor chip on said circuit board.

2. The method of mounting the semiconductor chip on the circuit board according to claim 1, wherein said heating and melting step heats the thermoplastic resin coat at 150° C.

3. The method of mounting the semiconductor chip on the circuit board according to claim 1, wherein said pressing step applies the ultrasonic wave of an ultrasonic vibration of a frequency of 63 kHz under pressure of a range of 0.1–0.3 kg/mm$^2$.

4. A method of manufacturing an electromagnetic wave readable data carrier having a body of a data carrier and an electronic component module, said body of the data carrier having an insulating base material and a conductive pattern held on the insulating base material, said electronic component module having a circuit board and a semiconductor chip with a terminal bump mounted on the circuit board, said circuit board having a wiring pattern with an electrode area and a thermoplastic resin coat covering the electrode area of the wiring pattern, said method comprising the steps of: manufacturing the electronic component module by mounting the semiconductor chip on the wiring pattern, said electronic component module manufacturing step comprising the substeps of: heating and melting the thermoplastic resin coat of said circuit board; pressing the terminal bump of said semiconductor chip on the thus melted thermoplastic resin coat while applying an ultrasonic wave to the terminal bump so that the terminal bump penetrates the melted thermoplastic resin coat and comes into contact with the electrode area; bonding the terminal bump and the electrode area by continuously applying an ultrasonic wave to the terminal bump while the terminal bump is in contact with the electrode area; cooling and solidifying the melted thermoplastic resin coat so as to securely mount said semiconductor chip on said circuit board; and integrating the electronic component module with the body of the data carrier.

5. The method of manufacturing the electromagnetic wave readable data carrier according to claim 4, wherein the insulating base material and the conductive pattern of said body of the data carrier are respectively a thin resin base material and a metal foil pattern, and the wiring pattern of said circuit board is an aluminum foil wiring pattern disposed on a thin resin base material.

* * * * *